(12) United States Patent
Arakawa et al.

(10) Patent No.: US 9,948,090 B2
(45) Date of Patent: Apr. 17, 2018

(54) SEMICONDUCTOR DEVICE

(71) Applicant: Renesas Electronics Corporation, Tokyo (JP)

(72) Inventors: Masashi Arakawa, Tokyo (JP); Tadashi Fukui, Tokyo (JP); Koji Takayanagi, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 382 days.

(21) Appl. No.: 14/865,418

(22) Filed: Sep. 25, 2015

(65) Prior Publication Data
US 2016/0094027 A1    Mar. 31, 2016

(30) Foreign Application Priority Data
Sep. 29, 2014  (JP) ................................ 2014-198264

(51) Int. Cl.
*H02H 9/00* (2006.01)
*H02H 9/04* (2006.01)
*H01L 27/02* (2006.01)

(52) U.S. Cl.
CPC ......... *H02H 9/044* (2013.01); *H01L 27/0285* (2013.01); *H02H 9/005* (2013.01)

(58) Field of Classification Search
USPC ........................................................ 361/56
See application file for complete search history.

(56) References Cited

U.S. PATENT DOCUMENTS

| | | | |
|---|---|---|---|
| 7,593,201 B2 | 9/2009 | Ishizuka et al. | |
| 2008/0304191 A1* | 12/2008 | Riviere | H01L 27/0285 361/56 |
| 2010/0328827 A1* | 12/2010 | Lai | H02H 9/046 361/56 |
| 2011/0128657 A1* | 6/2011 | Akai | H01L 27/0285 361/56 |
| 2013/0057992 A1* | 3/2013 | Altolaguirre | H02H 9/046 361/56 |
| 2013/0077195 A1* | 3/2013 | Stockinger | H02H 9/046 361/56 |
| 2013/0321963 A1* | 12/2013 | Lai | H01L 27/0248 361/56 |
| 2014/0036398 A1* | 2/2014 | Kuznetsov | H01L 27/0285 361/56 |
| 2014/0268444 A1* | 9/2014 | Bertin | H01L 27/0266 361/56 |
| 2014/0368957 A1* | 12/2014 | Kato | H02H 9/041 361/56 |

(Continued)

FOREIGN PATENT DOCUMENTS

JP    2006-121007 A    5/2006

*Primary Examiner* — Ronald W Leja
(74) *Attorney, Agent, or Firm* — Sughrue Mion, PLLC

(57) ABSTRACT

Provided is a semiconductor device making it possible to promote area reduction while maintaining ESD resistance. The semiconductor device includes a power wire, a ground wire and a protection circuit provided between the power wire and the ground wire so as to cope with electrostatic discharge. The protection circuit includes a first transistor, a first resistive element, a second transistor, a first capacitive element, a first inverter and a protection transistor. A gate width of the second transistor is narrower than a gate width of the first transistor.

11 Claims, 10 Drawing Sheets

(56) References Cited

U.S. PATENT DOCUMENTS

2015/0295399 A1* 10/2015 Wang ..................... H02H 9/046
                                                                  361/56
2016/0094027 A1*  3/2016 Arakawa ................ H02H 9/044
                                                                  361/56

* cited by examiner

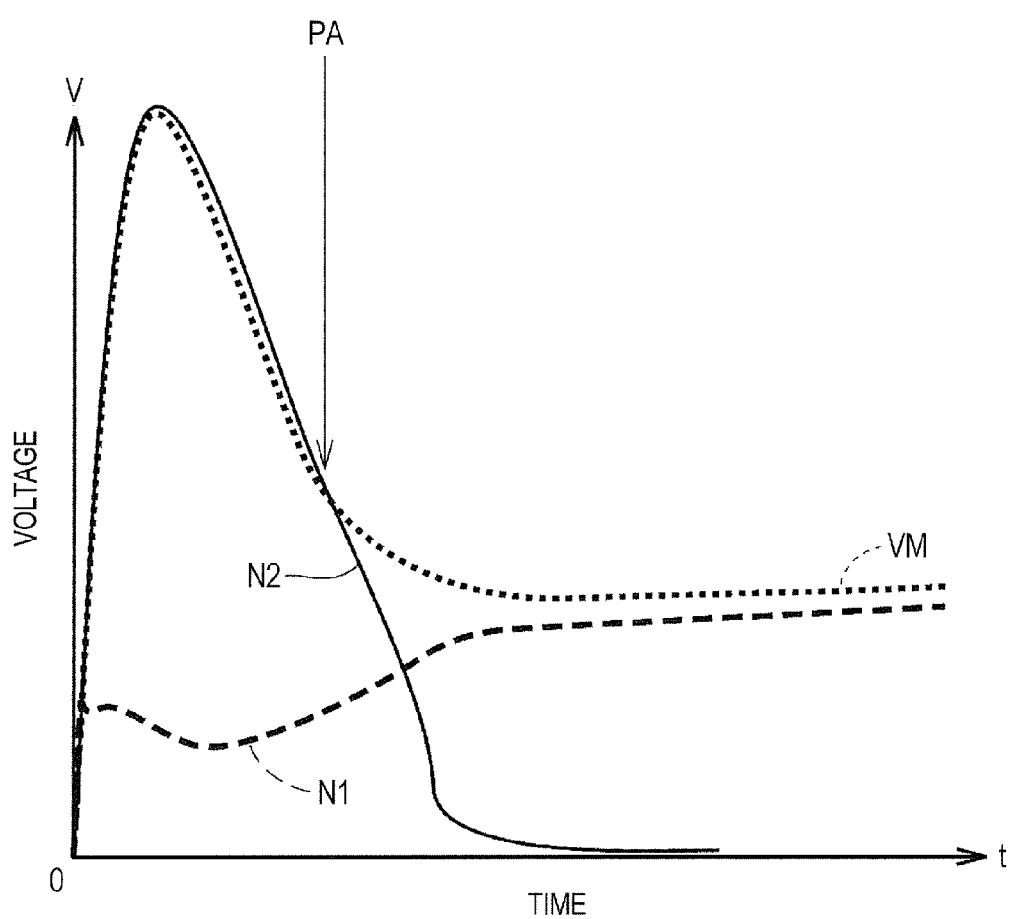

SEMICONDUCTOR DEVICE

CROSS-REFERENCE TO RELATED APPLICATIONS

The disclosure of Japanese Patent Application No. 2014-198264 filed on Sep. 29, 2014 including the specification, drawings and abstract is incorporated herein by reference in its entirety.

BACKGROUND

The present disclosure relates to a semiconductor device, and, in particular, relates to the semiconductor device which includes an ESD (Electro Static Discharge) protection element.

In recent years, there has been demanded a multi-pin semiconductor device which includes I/C pins (input/output pins) of the number exceeding thousands with advancement of function and performance of the semiconductor device. Accordingly, an area of each I/O block has come to greatly influence reductions in size and cost of the entire semiconductor device. As examples of an element which is large in ratio that the area of each I/O block occupies, an electrostatic discharge protection element (ESD protection element) and a driver element of high driving power are given.

In addition, since device resistance is reduced as the process generation advances and a reduction in area is promoted, it becomes important to improve the performance of the electrostatic discharge protection element (the ESD protection element) and various systems are proposed in order to improve the performance (see, for example, Japanese Unexamined Patent Publication No. 2006-121007.

SUMMARY OF THE INVENTION

However, although the technology described in Japanese Unexamined Patent Publication No. 2006-121007 discloses the ESD protection element configured by an RC time constant and an inverter, it is necessary to set values of a resistive element R and a capacitive element C comparatively high in order to drive the inverter while an ESD current is being released. Consequently, value setting of the resistance element R and the capacitive element C is left as a subject matter to be solved in order to promote area reduction.

The present disclosure has been made in view of the above-mentioned circumstance and aims to provide a semiconductor device making it possible to promote area reduction while maintaining the ESD resistance.

Other subject matters and novel features of the present disclosure will be apparent from the description of the present specification and the appended drawings.

According to one embodiment of the present disclosure, there is provided a semiconductor device which includes a power wire, a ground wire and a protection circuit provided between the power wire and the ground wire so as to cope with electrostatic discharge. The protection circuit includes a first transistor coupled between the power wire and the ground wire, a first resistive element coupled between the power wire and the ground wire in series with the first transistor, a second transistor coupled between the power wire and the ground wire in parallel with the first transistor so as to form a current mirror circuit together with the first transistor with a gate of which a first coupling node between the first transistor and the first resistive element is coupled, a first capacitive element coupled between the power wire and the ground wire in series with the second transistor, a first inverter with which a second coupling node between the second transistor and the first capacitive element is coupled as an input node, and a protection transistor which is coupled between the power wire and the ground wire and a gate of which receives an output from the first inverter. A gate width of the second transistor is narrower than a gate width of the first transistor.

According to embodiments of the present disclosure, it is possible to promote area reduction while maintaining the ESD resistance.

BRIEF DESCRIPTION OF THE DRAWINGS

FIG. 4 is an explanatory diagram illustrating one example of transition of each node and a power wire VM when the ESD current has been flown into each node and the power wire.

DETAILED DESCRIPTION

Figure 1:
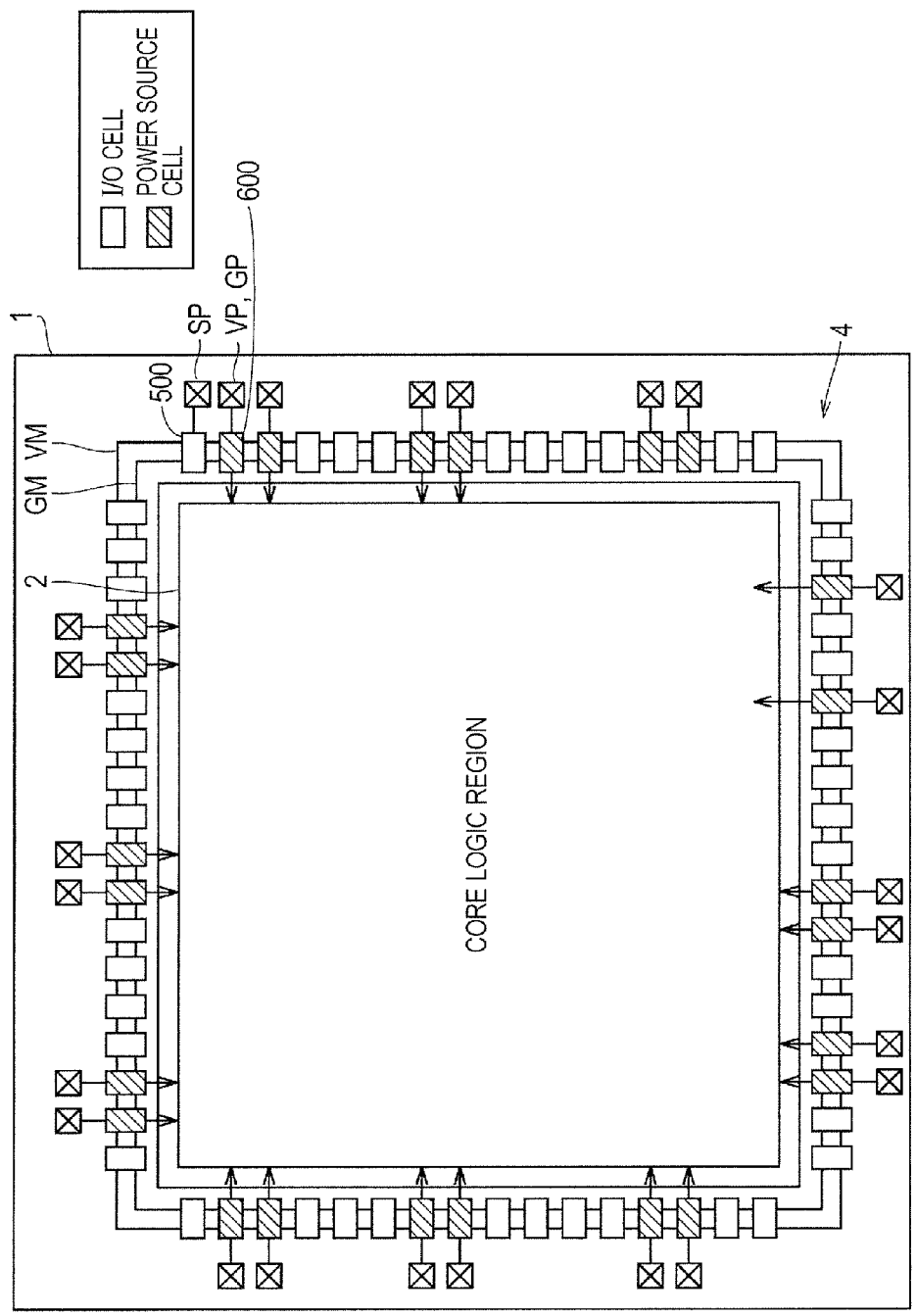
FIG. 1 is an explanatory diagram illustrating one example of the entire of a semiconductor device 1 according to a First Embodiment.

Preferred embodiments of the present disclosure will be described in detail with reference to the drawings. Incidentally, the same numerals are assigned to the same or corresponding parts in the drawings and the description thereof is omitted. In addition, in the embodiments of the present disclosure, the semiconductor device means any of a semiconductor wafer formed by integration of electronic circuits, each semiconductor chip formed by dicing the semiconductor wafer into chips and the one formed by packaging one semiconductor chip or a plurality of the semiconductor chips with resin and so forth.

First Embodiment

FIG. 1 is an explanatory diagram illustrating one example of the entire of the semiconductor device 1 according to a First Embodiment.

As illustrated in FIG. 1, the semiconductor device 1 includes a circumferential I/O region 4 which is provided in an outer peripheral region and a core logic region 2 which is arranged in an internal region and is configured as an ASIC (application specific integrated circuit) having a predetermined function.

The circumferential I/O region 4 includes the I/O cell 500 serving as an input/output interface for a signal, the power supply cell 600 which receives an input from an external power supply and so forth. Here, a case where the power wire VM and a ground wire GM are arranged in the outer peripheral region is illustrated. A pad VP is a pad for power supply and a pad GP is a pad for grounding and the pads MP and GP are coupled with the power supply cell 600. A pad SP is a pad for signal and is coupled with the I/O cell 500. Incidentally, the pads VP, GP and SP are provided along an outer peripheral side of the semiconductor device 1 in FIG. 1.

Figure 2:
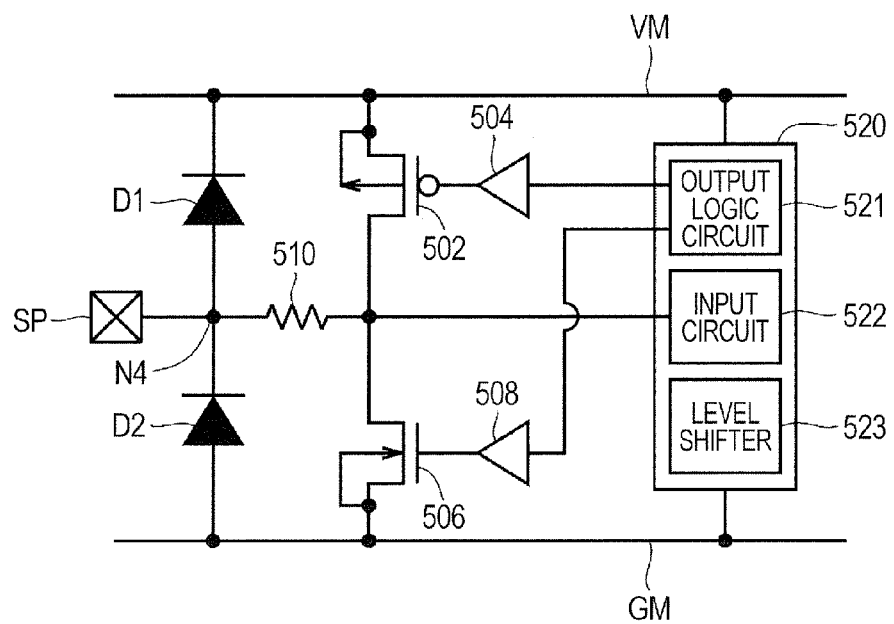
FIG. 2 is an explanatory diagram illustrating one example of a circuit configuration of an I/O cell 500 according to the First Embodiment.

FIG. 2 is an explanatory diagram illustrating one example of a circuit configuration of the I/O cell 500 according to the First Embodiment. As illustrated in FIG. 2, the I/O cell 500 includes protection diodes D1 and D2, a P channel MOS transistor 502, an N channel MOS transistor 506, drivers 504 and 508, a resistor 510, an input/output circuit 520 and so forth.

The signal pad SP is coupled with a node N4. The protection diode D1 is provided between the node N4 and the power wire VM. The protection diode D1 is coupled with the node N4 on the anode side and is coupled with the power wire VM on the cathode side. Here, the signal pad SP serves as an input/output pad and it is possible for the signal pad to receive an input signal and to output an output signal.

The protection diode D2 is provided between the node N4 and the ground wire GM. The protection diode D2 is coupled with the ground wire GM on the anode side and is coupled with the node N4 on the cathode side. The resistor 510 is provided between the node N4 and an input circuit 522.

The P channel MOS transistor 502 is provided in parallel with the protection diode D1 and is coupled in series between the node N4 and the power wire VM via the resistor 510. The P channel MOS transistor 502 receives an input signal from the driver 504. Incidentally, the drivers 504 and 508 each includes an even number of later described inverters and the power is supplied to the drivers 504 and 508 respectively through the power wire VM and the ground wire GM.

The N channel MOS transistor 506 is provided in parallel with the protection diode D2 and is coupled in series between the node N4 and the ground wire GM via the resistor 510. The N channel MOS transistor 506 receives an input signal from the driver 508.

The input/output circuit 520 is provided between the power wire VM and the ground wire GM. The input/output circuit 520 includes an output logic circuit 521 which drives the drivers 504 and 508, the input circuit 522 which processes the input signal which is sent from the pad SP via the resister 510 and a level shifter 523 which boosts (steps-up)/bucks (steps-down) the level of each signal.

Any one of the drivers 504 and 508 operates in accordance with a signal from the output logic circuit 521. Then, the P channel MOS transistor 502 or the N channel MOS transistor 506 conducts and the signal is output from the signal pad SP.

Figure 3:
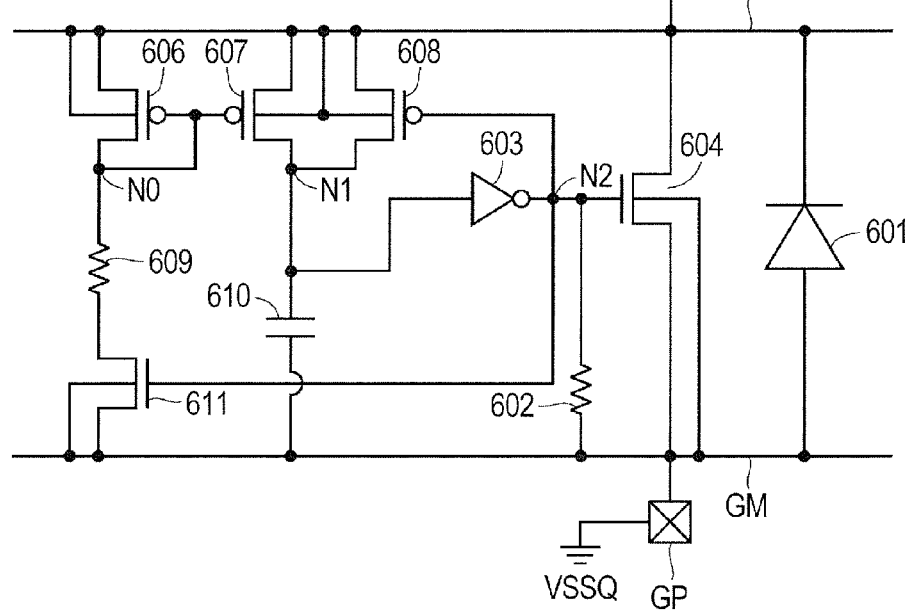
FIG. 3 is an explanatory diagram illustrating one example of a circuit configuration of a power supply cell 600 according to the First Embodiment.

FIG. 3 is an explanatory diagram illustrating one example of a circuit configuration of the power supply cell 600 according to the First Embodiment. As illustrated in FIG. 3, the power supply cell 600 includes an N channel MOS transistor 604, an inverter 603, resistive elements 602 and 609, a capacitive element 610, P channel MOS transistors 606, 607 and 608, an N channel MOS transistor 611 and so forth which configure a power clamp circuit (a protection circuit). A diode 601 is a parasitic diode of the N channel MOS transistor 604.

The diode 601 is coupled with the ground wire GM on the anode side and is coupled with the power wire VM on the cathode side.

The N channel MOS transistor 604 is coupled between the power wire VM and the ground wire GM and a gate of the N channel MOS transistor 604 is coupled with an output node N2 of the inverter 603.

The P channel MOS transistor 606 is coupled between the power wire VM and the ground wire GM in series with a resistive element 609 and an N channel MOS transistor 611.

The P channel MOS transistor 606 is provided between the power wire VM and a node N0 and a gate of the P channel MOS transistor 606 is coupled with the node N0. The resistive element 609 is coupled in series with the P channel MOS transistor 606, is coupled with the node N0 on one end side and is coupled with the N channel MOS transistor 611 on the other end side. The N channel MOS transistor 611 is coupled between the resistive element 609 and the ground wire GM and a gate of the N channel MOS transistor 611 is coupled with the output node N2.

The P channel MOS transistor 607 is provided between the power wire VM and a node N1 so as to form a current mirror circuit together with the P channel MOS transistor 606 and a gate of the P channel MOS transistor 607 is coupled with the node N0. The capacitive element 610 is coupled between the power wire VM and the ground wire GM in series with the P channel MOS transistor 607 via the node N1.

The inverter 603 outputs an inversion signal of a signal from the node N1 to the node N2 by using the node N1 as its input side. Incidentally, although a power supply of the inverter 603 is not illustrated, the power is supplied to the inverter 603 through the power wire VM and the ground wire GM and the same also applies to other embodiments.

The resistive element 602 is coupled between the node N2 and the ground wire GM. Since an output from the inverter 603 is pulled down to the ground wire GM via the resistive element 602, it is possible to suppress a fluctuation in level of an input into a gate of the N channel MOS transistor 604 when the level of an output from the inverter 603 has undesirably fluctuated.

The N channel MOS transistor 611 functions as an element which activates the current mirror circuit which is configured by the P channel MOS transistors 606 and 607, the resistive element 609 and so forth. The current mirror circuit is activated by turning the N channel MOS transistor 611 ON. On the other hand, when the N channel MOS transistor 611 is in an OFF state, the current mirror circuit is in an inactivated state. Here, activation of the current mirror circuit means to flow current to the transistors which configure the current mirror circuit to operate the current mirror circuit and the same also applies to other embodiments.

The P channel MOS transistor 608 is coupled between the power wire VM and the node N1 in parallel with the P channel MOS transistor 607 and a gate of the P channel MOS transistor 608 is coupled with the output node N2. The P channel MOS transistor 608 operates complementarily to the N channel MOS transistor 611. That is, when the N channel MOS transistor 611 is in an ON state, the P channel MOS transistor 608 is in the OFF state. On the other hand, in case of a steady state where the N channel MOS transistor 611 is in the OFF state, the P channel MOS transistor 608 is turned ON and couples the power wire VM with the node N1 so as to make it possible to suppress undesirable level fluctuation of the node N1.

Incidentally, although, here, the configuration of the power clamp circuit has been described as one example of the power supply cell 600, the power supply cell 610 may be configured as another circuit not limited to the power clamp circuit.

Here, a case where the ESD current is flowed into (applied to) the pad VP will be described. In the steady state, the level (of the potential) of the output node N2 of the inverter 603 is set to an "L" level. Accordingly, the N channel MOS transistor 604 is in the OFF state. In addition, the P channel MOS transistor 608 is in the ON state. Since the level of the output node N2 is at the "L" level, the N channel MOS transistor 611 is in the OFF state and the current mirror circuit is in the inactivated state.

On the other hand, when a high voltage generated owing to application of the ESD current is applied to the pad VP, the level of the power wire VM is directly changed following high voltage application. A potential difference (Vgs) is temporarily generated between a gate and a source of a P channel MOS transistor which configures the inverter 603 with changing the level of the power wire VM and the P channel MOS transistor is turned ON. Thereby, the level of the output node N2 is temporarily changed from the "L" level to an "H" level.

The N channel MOS transistor 604 is brought into the ON state with changing a gate potential of the output node N2 and the high voltage in the power wire VM is released into the ground wire GM.

In addition, the P channel MOS transistor 608 is turned OFF with changing the level of the output node N2 to the "H" level. In addition, the N channel MOS transistor 611 is turned ON and the current mirror circuit comes to operate.

Current flows from the power wire VM into the capacitive element 610 which is coupled with the node N1 via the P channel MOS transistor 607 with activation of the current mirror circuit. In that occasion, the level of the node N1 is changed and increased while being delayed in accordance with a time constant. Then, when the potential at the node N1 has exceeded a threshold value of the inverter 603, the N channel MOS transistor of the inverter 603 is turned ON. Thereby, the level of the output node N2 again shifts to the "L" level.

The N channel MOS transistor 604 is brought into the OFF state with changing the gate potential of the output node N2 and current outflow from the power wire VM toward the ground wire GM is stopped. In addition, the N channel MOS transistor 611 is turned OFF and the current mirror circuit is inactivated. In addition, the P channel MOS transistor 608 is turned ON and the node N1 and the power wire VM are electrically coupled together. Thereby, the circuit again returns to the steady state.

FIG. 4 is an explanatory diagram illustrating one example of transition of each node and the power wire VM when the ESD current has been flown into each node and the power wire VM.

As illustrated in FIG. 4, the level of the output node N2 is temporarily changed from the "L" level to the "H" level. Thereby, the N channel MOS transistor 604 is turned ON and the ESD current flows toward the ground wire GM side.

The P channel MOS transistor 608 begins turning ON at a timing PA. Thereby, the potential of the node N1 begins gradually increasing.

Then, the N channel MOS transistor 604 is gain turned OFF by changing the level of the output node N2 to the "L" level. Thereby, a current path from the power wire VM to the ground wire GM is shut off.

The protection circuit of the power supply cell 600 according to the First Embodiment is of a system that an amount of current flowing into the P channel MOS transistor 607 is adjusted by the current mirror circuit. Specifically, gate widths of the resistive element 609 and the P channel MOS transistor 607 are adjusted. As one example, the gate width of the P channel MOS transistor 607 is set to 1/N (N: 2 or more) the gate width of the P channel MOS transistor 606. It becomes possible to set the amount of current flowing into the P channel MOS transistor 607 to 1/N the amount of current flowing into the P channel MOS transistor 606 by setting the gate width of the P channel MOS transistor 607 to 1/N the gate width of the P channel MOS transistor 606.

In the example illustrated in FIG. 4, the amount of current which flows through the P channel MOS transistor 606 of the current mirror circuit is adjusted and the gate width of the P channel MOS transistor 607 is adjusted on the basis of the state of the resistive element 609, and thereby the amount of current which flows into the P channel MOS transistor 607 is adjusted. Thereby, it becomes possible to set a resistance value of the resistive element 609 small. It becomes possible to reduce an area of the circuit by setting the resistance value of the resistive element 609 small. In the following, description will be made on the above-mentioned point.

Figure 5A:
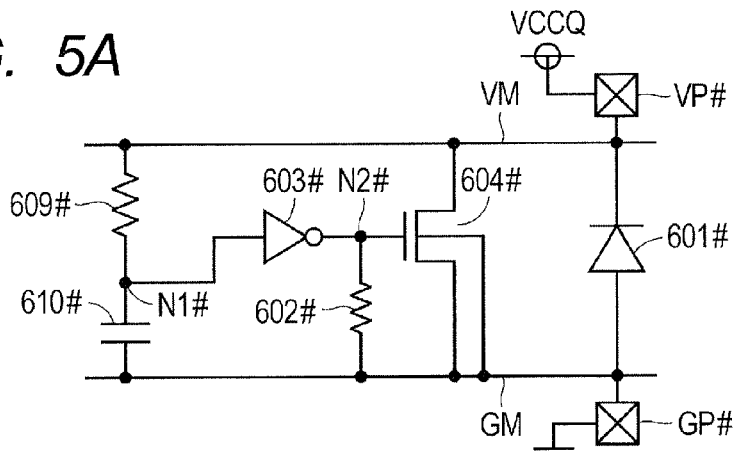
FIG. 5A is an explanatory diagram illustrating one example of a protection circuit of a comparative example.
Figure 5B:
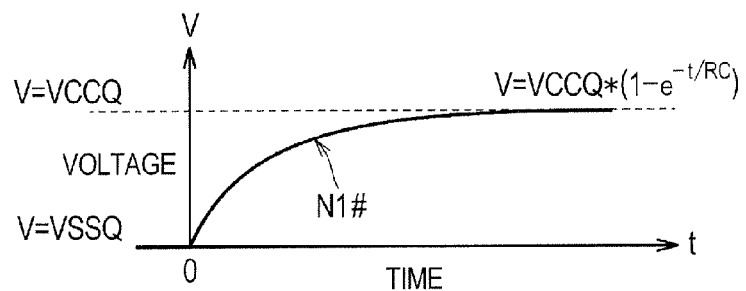
FIG. 5B is an explanatory diagram illustrating one example of the protection circuit of the comparative example.
Figure 5C:
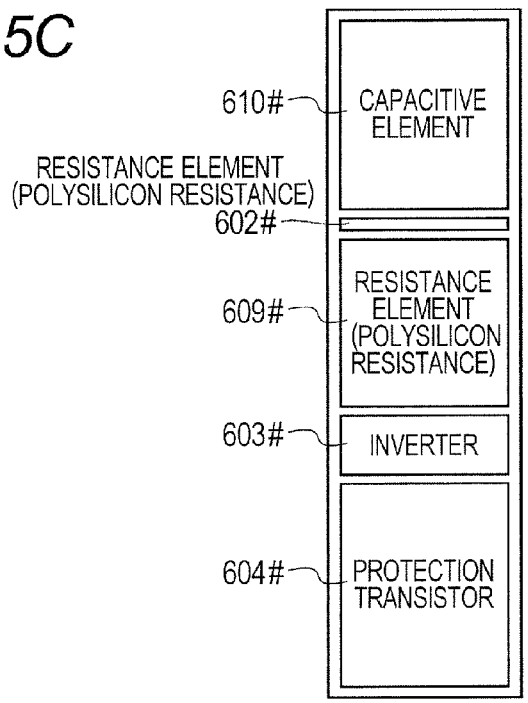
FIG. 5C is an explanatory diagram illustrating one example of the protection circuit of the comparative example.

FIG. 5A, FIG. 5B and FIG. 5C are explanatory diagrams each illustrating one example of a configuration of a protection circuit according to a comparative example. FIG. 5A is the explanatory diagram illustrating one example of the configuration of the protection circuit. As illustrated in FIG. 5A, a power clamp circuit (the protection circuit) of the comparative example includes an N channel MOS transistor 604#, an inverter 603#, resistive elements 602# and 609H and a capacitive element 610#. A diode 601# is a parasitic diode of the N channel MOS transistor 604#. In addition, a power supply pad VP# and a ground pad GP# are respectively coupled to the power wire VM and the ground wire GM.

Here, a case where the ESD current is flown into (applied to) the pad VP# will be described. In the steady state, the level of an output node N2# of the inverter 603# is set to the "L" level. Accordingly, the N channel MOS transistor 604# is in the OFF state.

On the other hand, when the high voltage generated owing to application of the ESD current is applied to the pad VP#, the level of the power wire VM is directly changed following high voltage application. The potential difference (Vgs) is temporarily generated between a gate and a source of a P channel MOS transistor which configures the inverter 603# with changing the level of the power wire VM and the P channel MOS transistor is turned ON. Thereby, the level of the output node N2# is temporarily changed from the "L" level to the "H" level.

The N channel MOS transistor 604# is brought into the ON state with changing the gate potential of the output node N2# and the high voltage in the power wire VM is released into the ground wire GM.

On the other hand, current flows into the capacitive element 610# which is coupled with a node N1# via the resistive element 609#. In that occasion, the level of the N1# is increased while being delayed in accordance with an RC time constant of the resistive element 609# and the capacitive element 610#. Then, when the potential of the node N1# has exceeded a threshold value of the inverter 603#, an N channel MOS transistor of the inverter 603# is turned ON. Thereby, the level of the output node N2# again shifts to the "L" level.

Thereby, the circuit again returns to the steady state. FIG. 5B is the explanatory diagram illustrating one example of a change in RC time constant.

A waveform obtained when electric charge is charged into the capacitive element 610# is illustrated in FIG. 5B.

Here, a voltage V is expressed as voltage V=VCCQ $(1-e^{-t/RC})$. This formula is deformed to $t=-\log e^{(V/VCCQ)} * RC$. Then, RC is expressed as $RC=-t/\log e^{(V/VCCQ)}$. Here, for example, the threshold value of the inverter 603# to be coupled to an RC time constant circuit is set to about 0.5*VCCQ (V/VCCQ=about 0.5) and a necessary time t is set to about 0.5 μs.

Then, $RC=-1 \mu s/\log e^{(0.5)}$=about $0.77*10^{-6}$ is obtained. If a capacitance value C of the capacitive element 610# is 1 pF, about 770 kΩ will be necessary as a resistance value R of the resistive element 609#.

Accordingly, since the capacitance value C of the capacitive element 610# and the resistance value R of the resistive element 609# amount to considerably high values, the layout area when designing the capacitive element 610 and the resistive element 609 is increased.

FIG. 5C schematically illustrates one example of an area ratio that the protection circuit occupies when laying out the protection circuit.

Here, when the capacitive element 610# of the capacitance value C=1 pF is to be designed with MOS capacitors, about 60 or more capacitors are necessary in case of a MOS transistor having the gate width of about 5 μm and the gate length of about 0.55 μm.

In addition, when the resistive element 609# of the resistance value R=about 770 kΩ is to be designed with polysilicon resistors, it becomes necessary to serially couple about 25 or more resistors in case of a polysilicon resistor having the gate width of about 0.4 μm and the gate length of about 24 μm respectively. Accordingly, as illustrated in FIG. 5C, the area ratio that the capacitive element 610# and the resistance element 609# occupy becomes considerably high.

On the other hand, the protection circuit of the power supply cell 600 according to the present First Embodiment is of the system that the amount of current flowing into the P channel MOS transistor 607 is adjusted by the current mirror circuit as described above.

Here, a case where the capacitive element 610 is designed with the same capacity value as that of the capacitive element 610# will be considered. Then, a case where the same amount of current as that of the capacitive element 610# is supplied to the capacitive element 610 will be considered.

In the configuration of the protection circuit in the comparative example, it is necessary to set the resistance value of the resistive element 609# high so as to reduce the amount of current to be supplied to the capacitive element. While, in the system according to the present First Embodiment, it is possible to reduce the current amount by adjusting the gate width of the P channel MOS transistor 607.

Specifically, the gate width of the P channel MOS transistor 607 is set to about 1/N (N: 2 or more) the gate width of the P channel MOS transistor 606.

Accordingly, the current flowing into the P channel MOS transistor 606 of the current mirror circuit is set to N times the current flowing into the P channel MOS transistor 607.

Thereby, it is possible to set the resistance value of the resistive element 609 to be coupled to the P channel MOS transistor 607 is set to 1/N the resistance value R of the resistive element 609#.

Figure 6:
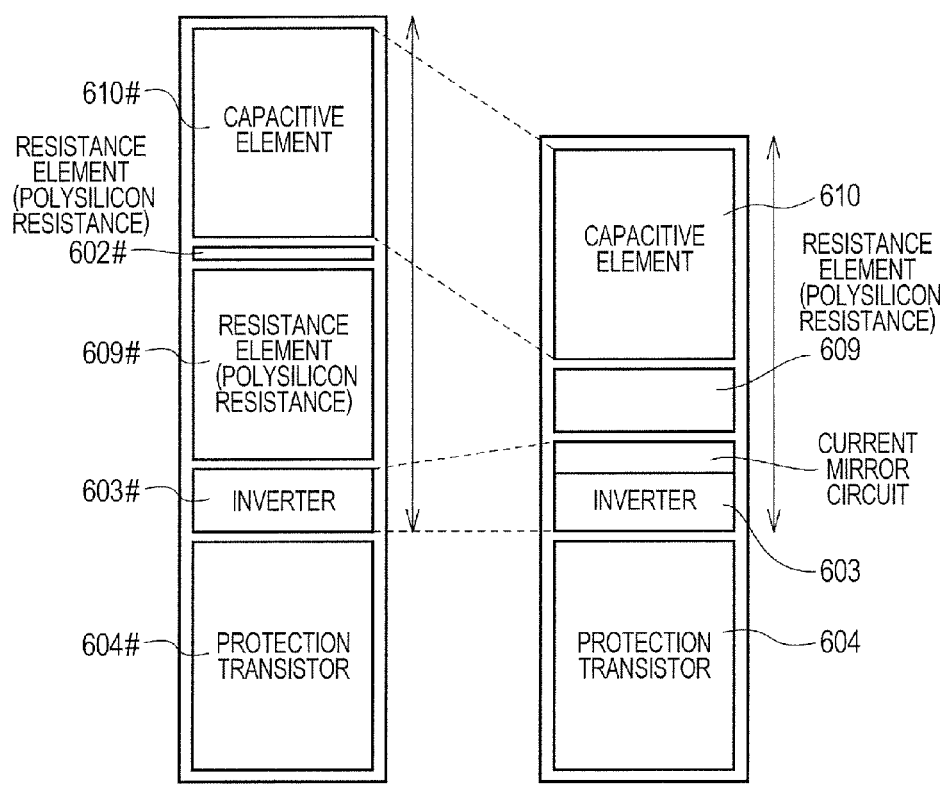
FIG. 6 is a diagram illustrating one example of comparison in layout between the protection circuit of the comparative example and the power supply cell 600 according to the First Embodiment.

FIG. 6 is a diagram illustrating one example of comparison in layout between the protection circuit of the comparative example and the power supply cell 600 according to the First Embodiment.

As illustrated in FIG. 6, since it is possible to reduce the resistance value of the resistive element 609 owing to the above-mentioned configuration, it is possible to reduce the layout area of the polysilicon resistor which forms the resistive element 609 and thereby it is possible to reduce the layout area of the entire protection circuit more than the layout area of the configuration of the comparative example.

Figure 7:
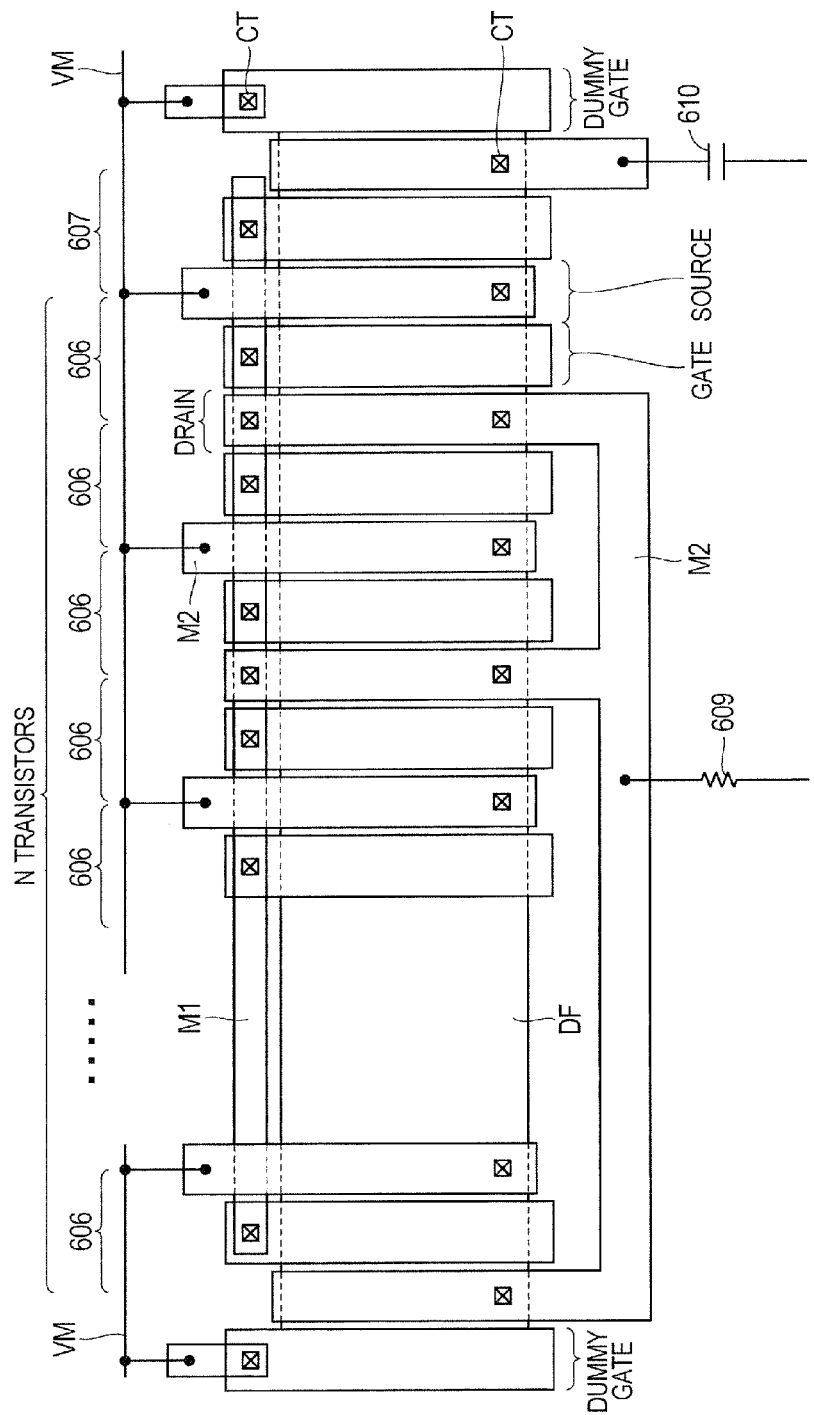
FIG. 7 is an explanatory diagram illustrating one example of a layout configuration of a current mirror circuit of the power supply cell 600 according to the First Embodiment.

FIG. 7 is an explanatory diagram illustrating one example of a layout configuration of the current mirror circuit of the power supply cell 600 according to the First Embodiment.

A case where N P channel MOS transistors are adjacently provided relative to one P channel MOS transistor 607 which configures the current mirror circuit is illustrated in FIG. 7.

Each transistor includes a gate electrode, a source electrode, a drain electrode, a diffusion layer DF and so forth. In addition, the gate electrode is provided between the source electrode and the drain electrode.

The source electrode of each transistor is coupled to the power wire VM and the drain electrode of each transistor is coupled to the resistor 609.

The source electrode and the drain electrode of each transistor are formed in a metal layer M2 which is the second layer configuring each transistor. The metal layer M2 is coupled with the diffusion layer DF through a contact hole CT.

The gate electrodes of the respective transistors are commonly coupled to a metal layer M1 which is the first layer. Gates on the both ends of each gate electrode are dummy gates and the dummy gates are not used for formation of the transistor.

The metal layer M2 which forms the drain electrode provided between the gate which forms the transistor 607 and the dummy gate is coupled to a capacitor 610. The dummy gate is also coupled to the power wire VM through the contact hole CT.

In addition, the metal layer M1 to be coupled with the gate electrode is coupled with the metal layer M2 which forms the drain electrode through the contact hole CT. Incidentally, although a plurality of the contact holes CT are present in each electrode, one or two contact hole(s) is/are illustrated in FIG. 7 and illustration of the remaining contact holes CT is omitted.

Figure 8:
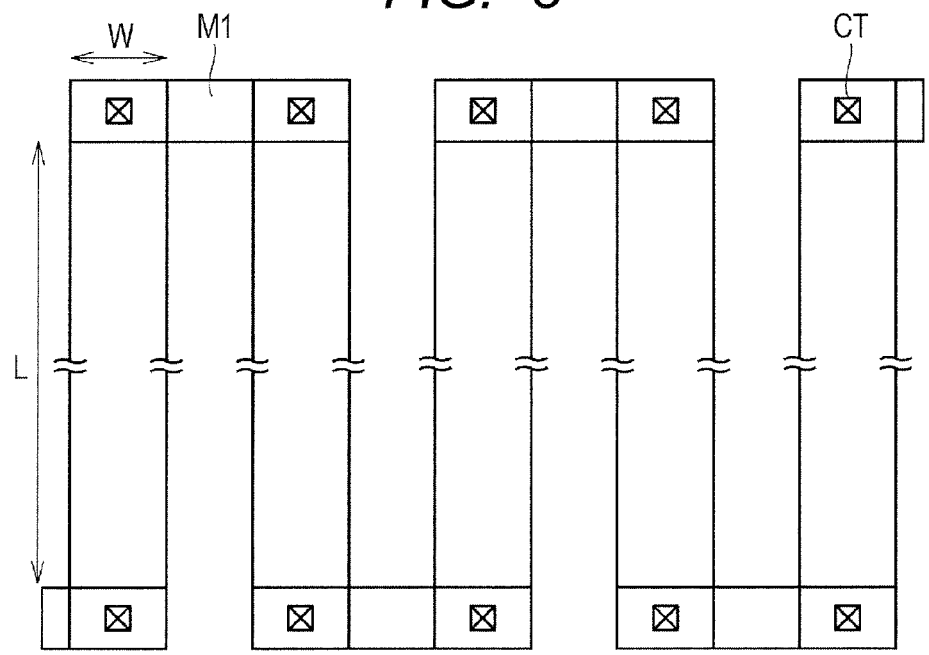
FIG. 8 is an explanatory diagram illustrating one example of a layout configuration of a resistive element of the power supply cell 600 according to the First Embodiment.

FIG. 8 is an explanatory diagram illustrating one example of a layout configuration of the resistive element of the power supply cell 600 according to the First Embodiment.

In FIG. 8, as the layout configuration of the resistive element 609 (the polysilicon resistor), sub-elements of the resistive element 609 are coupled in series with one another via the contact holes CT and the metal layers M1 into the folded form. Here, the above-described gate width W and gate length L are illustrated.

Incidentally, although in the First Embodiment, a case where the capacitive element 610 is designed with the same capacity value as that of the capacitive element 610# has been described by way of example, the present disclosure is not limited to the case and the capacity value of the capacitive element 610 may be further reduced by adjusting the gate width of the P channel MOS transistor 607 so as to reduce the amount of current. Thereby, it is possible to further reduce the layout area of the entire protection circuit by further reducing the ratio that the MOS capacitors of the capacitive element 610 occupy. Incidentally, the same also applies to the following embodiments.

Incidentally, although in the First Embodiment, the configuration that the gate width is adjusted as the size of the P channel MOS transistor 607 so as to reduce the current amount has been described, the size to be reduced is not limited to the gate width and the gate length may be adjusted so as to reduce the current amount. For example, the gate length of the P channel MOS transistor 607 is set longer than the gate length of the P channel MOS transistor 606 by way of example. It is possible to more reduce the amount of current flowing into the P channel MOS transistor 607 than the amount of current flowing into the P channel MOS transistor 606 by setting the gate length of the P channel MOS transistor 607 longer than the gate length of the P channel MOS transistor 606.

Modified Example

Figure 9:
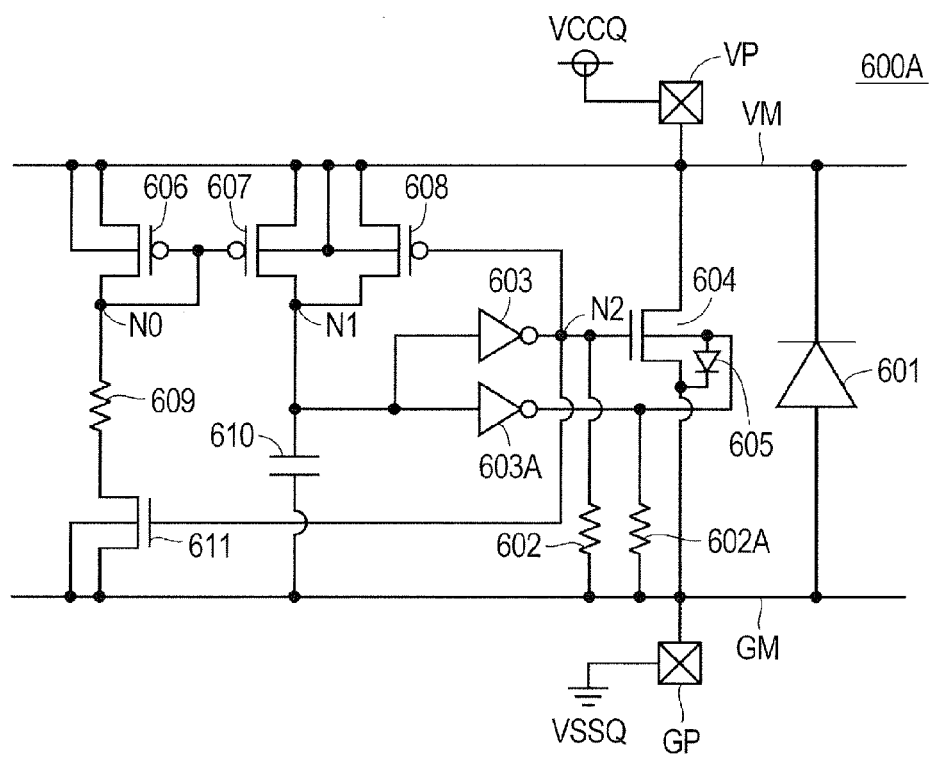
FIG. 9 is an explanatory diagram illustrating one example of a circuit configuration of a power supply cell 600A according to a modified example of the First Embodiment.

FIG. 9 is an explanatory diagram illustrating one example of a circuit configuration of a power supply cell 600A according to a modified example of the First Embodiment.

As illustrated in FIG. 9, the power supply cell 600A is of a configuration that a function of controlling a back gate of the N channel MOS transistor 604 is added in comparison with the power supply cell 600.

Specifically, the power supply cell 600A is different from the power supply cell 600 in that an inverter 603A has been provided between the node N1 and the back gate of the N channel MOS transistor 604 and a resistive element 602A has been added between an output node of the inverter 603A and the ground wire GM. Other configurations are the same as those of the First Embodiment and therefore detailed description thereof is omitted.

The resistive element 602A is coupled between the output node of the inverter 603A and the ground wire GM. Since an output from the inverter 603A is pulled down to the ground wire GM via the resistive element 602A, it is possible to suppress fluctuation of an input into the back gate region (the well region) when the output from the inverter 603A has undesirably fluctuated.

A parasitic diode 605 is formed on a junction between the back gate region (the well region) and a source of the N channel MOS transistor 604. There is the possibility that the level of a gate input when the N channel MOS transistor 604 is to be turned ON may be lowered by the amount of a forward voltage (VF) of the parasitic diode 605 due to the action of the parasitic diode 605 and it may become difficult to fully swing the gate input into the N channel MOS transistor 604.

Therefore, it becomes possible to fully swing the gate input when the N channel MOS transistor 604 is to be turned ON by preforming gate input into the N channel MOS transistor 604 and biasing of the back gate region (the well region) of the N channel MOS transistor 604 by mutually different inverters 603 and 603A. Thereby, it is possible to promote speeding-up of ESD current discharge of the N channel MOS transistor 604.

Incidentally, in the modified example in FIG. 9, although the configuration that the N channel MOS transistor 611 which activates the current mirror circuit and the P channel MOS transistor 608 which operates complementarily to the N channel MOS transistor 611 are used has been described, a configuration with no provision of such transistors as mentioned above is also possible.

Second Embodiment

In a Second Embodiment, a system configured to further improve the ESD discharge characteristic will be described.

Figure 10A:
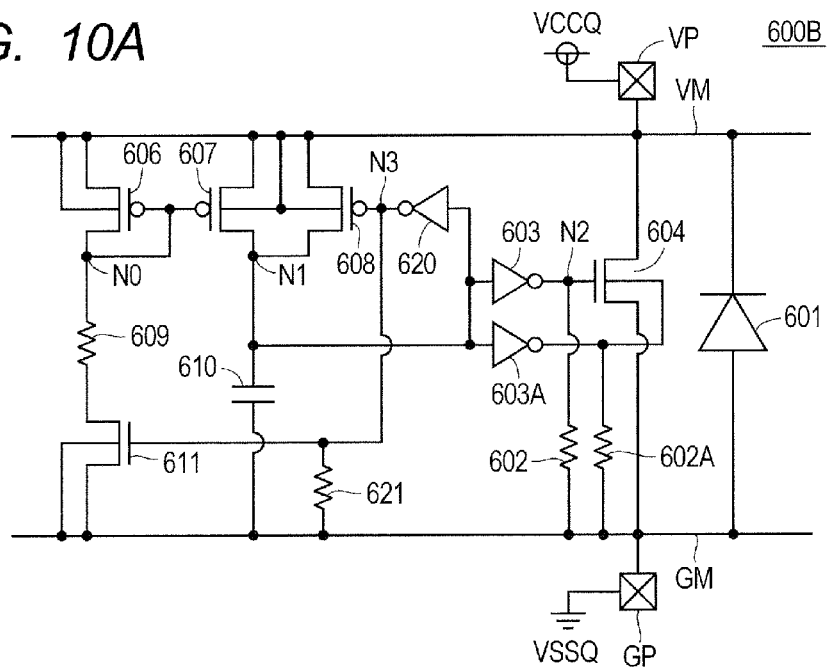
FIG. 10A is an explanatory diagram illustrating one example of a power supply cell 600B according to a Second Embodiment.
Figure 10B:
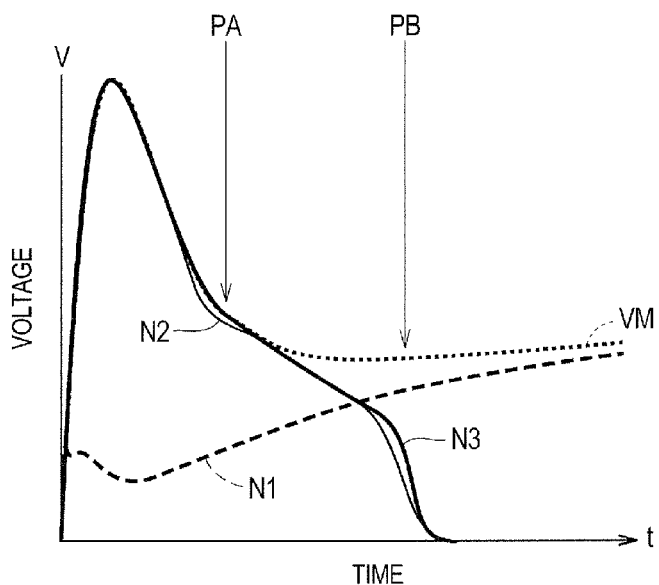
FIG. 10B is an explanatory diagram illustrating one example of the power supply cell 600B according to the Second Embodiment.

FIG. 10A and FIG. 10B are explanatory diagrams each illustrating one example of a circuit configuration of a power supply cell 600B according to the Second Embodiment. FIG. 10A is the explanatory diagram of one example of the circuit configuration of the power supply cell 600B.

As illustrated in FIG. 10A, the power supply cell 600B is different from the power supply cell 600A in that an inverter 620 and a resistive element 621 have been further provided.

The inverter 620 outputs a signal to a node N3 with the node N1 being used as an input node. A gate of the P channel MOS transistor 608 is coupled with the node N3. In addition, the N channel MOS transistor 611 is coupled with node N3.

The resistive element 621 is coupled between the node N3 and the ground wire GM. The power supply cell 600B is different from the power supply cell 600A in that the gates of the P channel MOS transistor 608 and the N channel MOS transistor 611 receive not the output from the inverter 603 but the output from the inverter 620.

Since other configurations and operations are the same as those of the power supply cell 600A, detailed description thereof is omitted. FIG. 10B is the explanatory diagram illustrating one example of transition of each node and the power wire VM when the ESD current has been flown into each node and the power wire VM.

As illustrated in FIG. 10B, the level of the output node N2 is temporarily changed from the "L" level to the "H" level. Thereby, the N channel MOS transistor 604 is turned ON and the ESD current flows toward the ground wire GM side.

The P channel MOS transistor 608 beings turning ON at the timing PA and thereby the potential of the node N1 beings gradually increasing.

Then, the level of the output node N2 is changed to the "L" level and thereby the N channel MOS transistor 604 is again turned OFF. Thereby, the current path from the power wire VM to the ground wire GM is shut off.

In the example in FIG. 4, since the output node N2 of the inverter 603 is coupled to the gate of the N channel MOS transistor 608, the P channel MOS transistor 608 begins turning ON after the timing PA. Thereby, potential increasing of the node N1 is accelerated.

On the other hand, in the example illustrated in FIG. 10B, the P channel MOS transistor 608 is turned ON at a timing PB that the potential of the node N1 has been sufficiently increased.

Accordingly, early increasing of the potential of the node N1 is suppressed by delaying a timing that the P channel MOS transistor 608 is turned ON and thereby it is possible to delay a time that the gate potential of the N channel MOS transistor 604 is set to the "L" level. Thereby, the ON time of the N channel MOS transistor 604 is increased without increasing the values of the resistive element 609 and the capacitive element 610, and thereby it becomes possible to further improve the ESD discharge characteristic and it becomes also possible to reduce the layout area.

Modified Examples of Second Embodiment

Figure 11A:
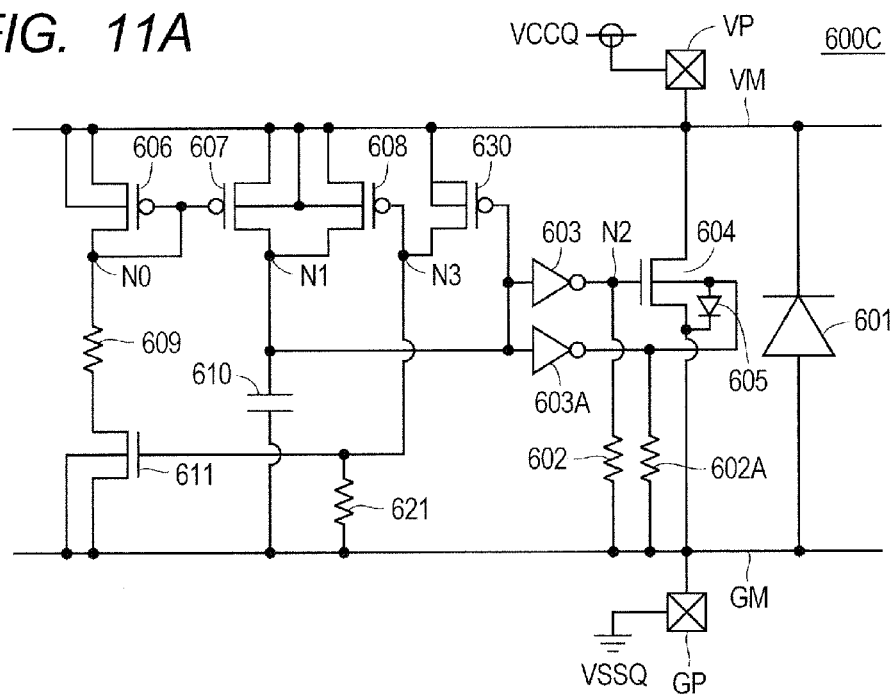
FIG. 11A is an explanatory diagram illustrating one example of a circuit configuration of one power supply cell according to one modified example of the Second Embodiment.
Figure 11B:
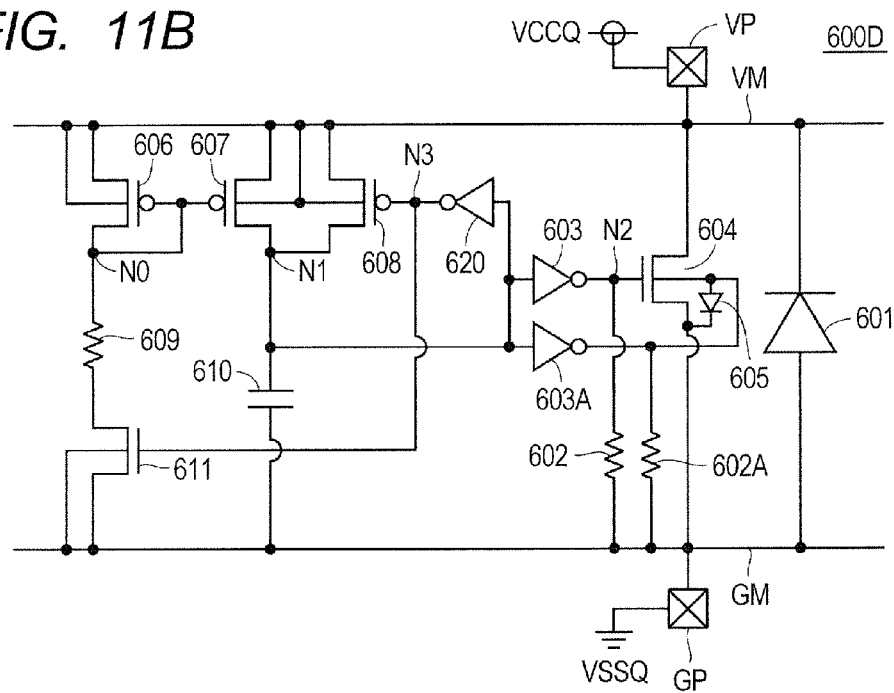
FIG. 11B is an explanatory diagram illustrating one example of a circuit configuration of another power supply cell according to another modified example of the Second Embodiment.

FIG. 11A and FIG. 11B are explanatory diagrams each illustrating one example of a circuit configuration of a power supply cell according to a modified example of the Second Embodiment.

FIG. 11A is an explanatory diagram illustrating one example of the circuit configuration of a power supply cell 600C. As illustrated in FIG. 11A, the power supply cell 600C is different from the power supply cell 600B in that a P channel MOS transistor 630 has been provided in place of the inverter 620. Other configurations are the same as those of the power supply cell 600B.

That is, the power supply cell 600C is of a configuration that the N channel MOS transistor which configures the inverter 620 has been deleted. The configuration is of the type that potential decreasing of the node N3 caused by provision of the N channel MOS transistor has been eliminated. Elimination of the N channel MOS transistor makes it difficult to decrease the potential of the node N3 and thereby it becomes possible to delay the timing that the P channel MOS transistor 608 is turned ON.

Thereby, early increasing of the potential of the node N1 is suppressed and thereby it becomes possible to delay the time that the gate potential of the N channel MOS transistor 604 is set to the "L" level. Thereby, the ON time of the N channel MOS transistor 604 is increased without increasing the values of the resistance element 609 and the capacitive element 610, and thereby it becomes possible to further improve the ESD discharge characteristic and it becomes also possible to reduce the layout area.

FIG. 11B is the explanatory diagram illustrating one example of a circuit configuration of a power supply cell 600D. As illustrated in FIG. 11B, the power supply cell 600D is different from the power supply cell 600B in that the resistive element 621 has been deleted. Other configurations are the same as those of the power supply cell 600B.

That is, it is made difficult to decrease the potential of the node N3 by deleting the resistive element 621 and thereby it becomes possible to delay the timing that the P channel MOS transistor 608 is turned ON.

Thereby, early increasing of the potential of the node N1 is suppressed and thereby it is possible to delay the time that the gate potential of the N channel MOS transistor 604 is set to the "L" level. Thereby, the ON time of the N channel MOS transistor 604 is increased without increasing the values of the resistance element 609 and the capacitive element 610, and thereby it becomes possible to further improve the ESD discharge characteristic and it becomes also possible to reduce the layout area.

Third Embodiment

Figure 12A:
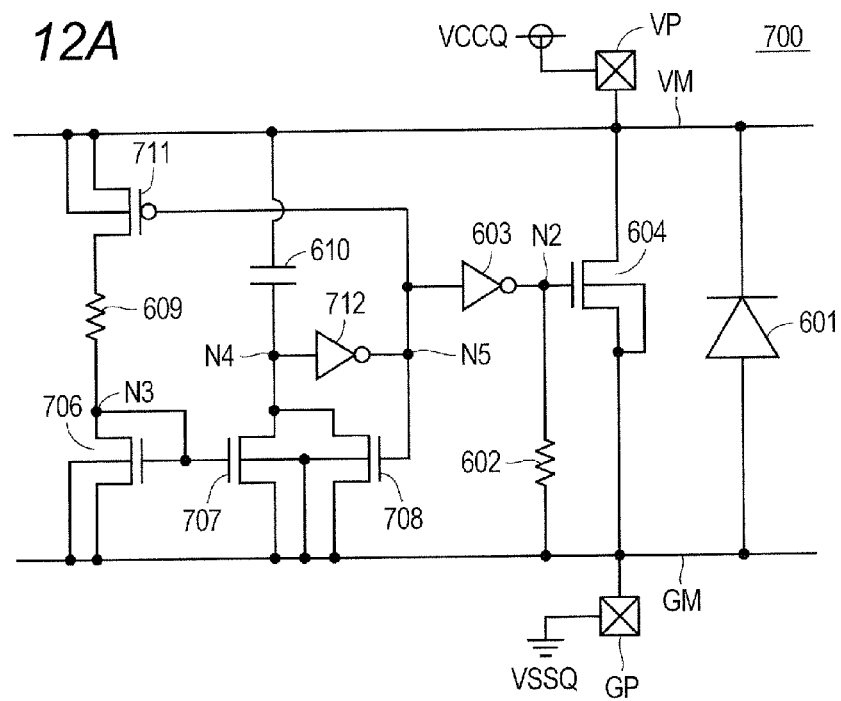
FIG. 12A is an explanatory diagram illustrating one example of a circuit configuration of a power supply cell according to a Third Embodiment.
Figure 12B:
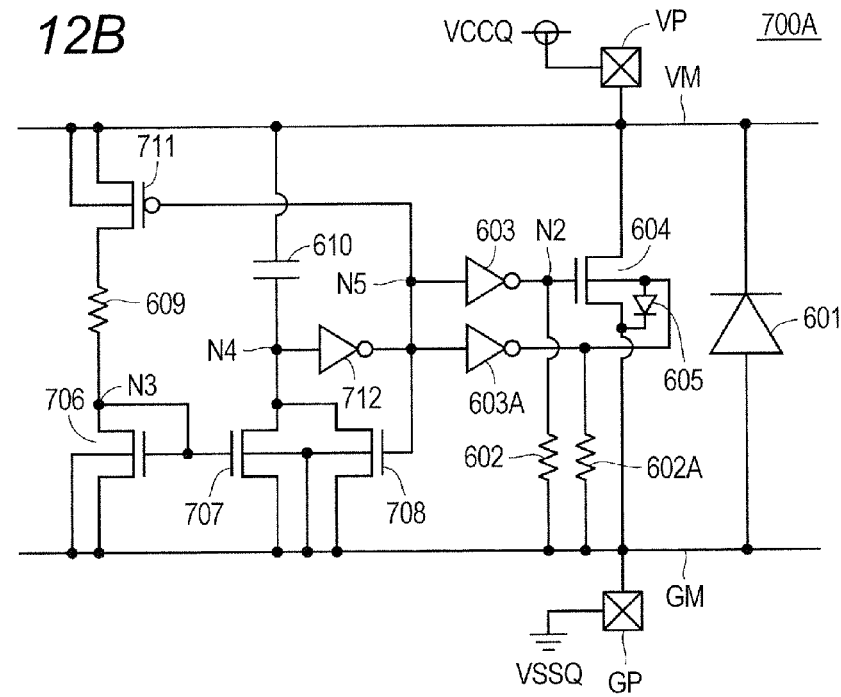
FIG. 12B is an explanatory diagram illustrating one example of a circuit configuration of a power supply cell according to a modified example of the Third Embodiment.

FIG. 12A and FIG. 12B are explanatory diagrams each illustrating one example of a circuit configuration of a power supply cell according to a Third Embodiment.

FIG. 12A is the explanatory diagram illustrating one example of a circuit configuration of a power supply cell 700. As illustrated in FIG. 12A, the power supply cell 700 is different from the power supply cell 600 in that the current mirror circuit is formed by N channel MOS transistors.

Specifically, the power supply cell 700 is different from the power supply cell 600 in that N channel MOS transistors 706, 707 and 708 have been provided in place of the P channel MOS transistors 606, 607 and 608, a P channel MOS transistor 711 has been provided in place of the N channel MOS transistor 611 and further an inverter 712 has been added.

Specifically, the N channel MOS transistor 706 is coupled in series with the resistive element 609 and the P channel MOS transistor 711 between the power wire VM and the ground wire GM.

The N channel MOS transistor 706 is provided between the ground wire GM and the node N3 and a gate thereof is coupled with the node N3. The resistive element 609 is coupled in series with the N channel MOS transistor 706, is coupled with the node N3 on the one end side thereof and is coupled with the P channel MOS transistor 711 on the other end side thereof. The P channel MOS transistor 711 is coupled between the resistive element 609 and the power wire VM and a gate thereof is coupled with a node N5.

The inverter 712 is coupled with the node N4 on the input side thereof and outputs a signal to the node N5. The N channel MOS transistor 707 is provided between the ground wire GM and the node N4 so as to form a current mirror circuit together with the N channel MOS transistor 706 and a gate thereof is coupled with the node N3.

The capacitive element 610 is coupled in series with the N channel MOS transistor 707 via the node N4 between the power wire VM and the ground wire GM.

The inverter 603 outputs an inversion signal of a signal input into the node N5 to the output node N2 with the node N5 being set as its input side.

The P channel MOS transistor 711 functions as an element which activates the current mirror circuit configured by the N channel MOS transistors 706 and 707 and the resistive element 609. The current mirror circuit is activated by turning the P channel MOS transistor 711 ON. On the other hand, when the P channel MOS transistor 711 is in the OFF state, the current mirror circuit is an inactivated state.

The N channel MOS transistor 708 is coupled in parallel with the N channel MOS transistor 707 between the ground wire GM and the node N4 and a gate thereof is coupled with the node N5. The N channel MOS transistor 708 operates complementarily to the P channel MOS transistor 711. That is, when the P channel MOS transistor 711 is in the ON state, the N channel MOS transistor 708 is in the OFF state. On the other hand, in the steady state where the P channel MOS transistor 711 is in the OFF state, the N channel MOS transistor 708 is turned ON to couple the ground wire GM with the node N4 to make it possible to suppress undesirable level fluctuation of the node N4.

Incidentally, although, here, the configuration of the power clamp circuit has been described as one example of the power supply cell 700, the power supply cell 700 is not limited to the power clamp circuit and may configure another circuit.

Here, a case where the ESD current is flown into (applied to) the pad VP will be described. The level of the node N4 is set to the "L" level in the steady state. The level of the node N5 which is provided with the inverter 712 interposed is set to the "H" level. Accordingly, the N channel MOS transistor 708 is in the ON state. In addition, since the level of the node N5 is set to the "H" level, the level of the output node N2 of the inverter 603 is set to the "L" level. Accordingly, the N channel MOS transistor 604 is in the OFF state.

Since the level of the node N5 is set to the "H" level, the P channel MOS transistor 711 is in the OFF state and the current mirror circuit is in the inactivated state.

On the other hand, when the high voltage generated owing to application of the ESD current is applied to the pad VP, the level of the power wire VM is directly changed following high voltage application. The potential difference (Vgs) is temporarily generated between the gate and the source of the P channel MOS transistor which configures the inverter 603 with changing the level of the power wire VM and the P channel MOS transistor is turned ON. Thereby, the level of the output node N2 is temporarily changed from the "L" level to an "H" level. The N channel MOS transistor 604 is brought into the ON state with changing the gate potential of the output node N2 and the high voltage in the power wire VM is released into the ground wire GM.

In addition, the N channel MOS transistor 708 is turned OFF with changing the level of the output node N5 from the "H" level to the "L" level. In addition, the P channel MOS transistor 711 is turned ON and the current mirror circuit comes to operate.

Current flows from the node N4 toward the ground wire GM via the N channel MOS transistor 707 with activation of the current mirror circuit. In that occasion, the level of the node N1 is changed and decreased while being delayed in accordance with the time constant. Then, when the potential of the node N4 has exceeded a threshold value of the inverter 712, the level of the node N5 is set to the "H" level and the N channel MOS transistor of the inverter 603 is turned ON. Thereby, the level of the potential of the output node N2 again shifts to the "L" level.

The N channel MOS transistor 604 is brought into the OFF state with changing the gate potential of the output node N2 and current outflow from the power wire VM into the ground wire GM is stopped. In addition, the P channel MOS transistor 711 is turned OFF and the current mirror circuit is inactivated. In addition, the N channel MOS transistor 708 is turned ON and the node N1 and the power wire VM are electrically coupled together. Thereby, the circuit again returns to the steady state.

In the example illustrated in FIG. 12A, the amount of current flowing through the N channel MOS transistor 706 of the current mirror circuit is adjusted and the gate width of the N channel MOS transistor 707 is adjusted on the basis of the state of the resistive element 609, and thereby the amount of current flowing into the N channel MOS transistor 707 is adjusted. Thereby, it becomes possible to set the resistance value of the resistive element 609 small as described in the First Embodiment. It becomes possible to reduce the circuit area by setting the resistance value of the resistive element 609 small.

FIG. 12B is the explanatory diagram illustrating one example of a circuit configuration of a power supply cell 700A according to a modified example of the Third Embodiment.

As illustrated in FIG. 12B, the power supply cell 700A is of a configuration that a function of controlling the back gate of the N channel MOS transistor 604 has been added in comparison with the power supply cell 700.

Specifically, the power supply cell 700A is different from the power supply cell 700 in that the inverter 603A has been provided between the node N5 and the back gate of the N channel MOS transistor 604 and the resistive element 602A has been added between the output node of the inverter 603A and the ground wire GM. Other configurations are the same as those of the power supply cell 700 and therefore detailed description thereof is omitted.

The resistive element 602A is coupled between the output node of the inverter 603A and the ground wire GM. Since the output from the inverter 603A is pulled down to the ground wire GM via the resistive element 602A, it is possible to suppress fluctuation of an input into the back gate region (the well region) when the output from the inverter 603A has undesirably fluctuated.

The parasitic diode 605 is formed on the junction between the back gate region (the well region) and the source of the N channel MOS transistor 604. There is the possibility that the level of the gate input when the N channel MOS transistor 604 is to be turned ON may be lowered by the amount of the forward voltage (VF) of the parasitic diode 605 due to the action of the parasitic diode 605 and it may become difficult to fully swing the gate input into the N channel MOS transistor 604.

Therefore, it is possible to fully swing the gate input when the N channel MOS transistor 604 is to be turned ON by preforming gate input into the N channel MOS transistor 604 and biasing of the back gate region (the well region) of the N channel MOS transistor 604 by mutually different inverters 603 and 603A. Thereby, it is possible to promote speeding-up of the ESD current discharge of the N channel MOS transistor 604.

Since even when the current mirror circuit is configured by the N channel MOS transistors, it becomes possible to decrease the resistance value of the resistance element 609 as in the case in the First Embodiment, it becomes possible to more reduce the layout area of the entire protection circuit than the configuration of the comparative example by reducing the layout area of the polysilicon resistor which forms the resistive element 609.

Although, in the foregoing, the present disclosure has been described specifically on the basis of the preferred embodiments, it goes without saying that the present disclosure is not limited to the above-mentioned embodiments and may be modified in a variety of ways within a range not deviating from the gist of the present disclosure.

What is claimed is:

1. A semiconductor device, comprising:
    a power wire;
    a ground wire; and
    a protection circuit provided between the power wire and the ground wire so as to cope with electrostatic discharge,
        wherein the protection circuit includes a first transistor coupled between the power wire and the ground wire, a first resistive element coupled between the power wire and the ground wire in series with the first transistor, a second transistor coupled between the power wire and the ground wire in parallel with the first transistor so as to form a current mirror circuit together with the first transistor with a gate of which a first coupling node between the first transistor and the first resistive element is coupled, a first capacitive element coupled between the power wire and the ground wire in series with the second transistor, a first inverter with which a second coupling node between the second transistor and the first capacitive element is coupled as an input node, and a protection transistor which is coupled between the power wire and the ground wire and a gate of which receives an output from the first inverter, and a gate width of the second transistor is narrower than a gate width of the first transistor.

2. The semiconductor device according to claim 1, wherein the protection circuit further includes a third transistor which is coupled between the power wire and the ground wire in series with the first resistive element so as to operate the current mirror circuit in accordance with an output from the first inverter.

3. The semiconductor device according to claim 2, wherein the protection circuit further includes a fourth transistor which is coupled between the power wire and the second coupling node in parallel with the second transistor so as to operate complementarily to the third transistor.

4. The semiconductor device according to claim 3, wherein the protection circuit further includes a second inverter with an output terminal of which a gate of the third transistor is coupled and with an input terminal of which the second coupling node is coupled.

5. The semiconductor device according to claim 4, wherein the protection circuit further includes a second resistive element coupled between the gate of the third transistor and the ground wire.

6. The semiconductor device according to claim 3, wherein the protection circuit further includes a fifth transistor which is coupled between the power wire and the gate of the third transistor and a gate of which is coupled with the second coupling node, and a second resistive element which is coupled between the gate of the third transistor and the ground wire.

7. The semiconductor device according to claim 1, wherein the first resistive element is a polysilicon resistor.

8. The semiconductor device according to claim 1, wherein at least one of the power wire and the ground wire is coupled with a pad.

9. The semiconductor device according to claim 1, further comprising:
an input/output circuit coupled between the power wire and the ground wire in parallel with the protection circuit.

10. The semiconductor device according to claim 1, wherein the protection circuit further includes a third inverter which is provided in parallel with the first inverter and is adapted to control a back gate of the protection transistor by using the second coupling node as an input node.

11. A semiconductor device, comprising:
a power wire;
a ground wire; and
a protection circuit provided between the power wire and the ground wire so as to cope with electrostatic discharge,
wherein the protection circuit includes a first transistor coupled between the power wire and the ground wire, a first resistive element coupled between the power wire and the ground wire in series with the first transistor, a second transistor coupled between the power wire and the ground wire in parallel with the first transistor so as to form a current mirror circuit together with the first transistor with a gate of which a first coupling node between the first transistor and the first resistive element is coupled, a first capacitive element coupled between the power wire and the ground wire in series with the second transistor, a first inverter with which a second coupling node between the second transistor and the first capacitive element is coupled as an input node, and a protection transistor which is coupled between the power wire and the ground wire and a gate of which receives an output from the first inverter, and a gate length of the second transistor is longer than a gate length of the first transistor.

* * * * *